(12) United States Patent
Kuttner

(10) Patent No.: US 7,640,002 B2
(45) Date of Patent: Dec. 29, 2009

(54) RF AMPLIFIER

(75) Inventor: Franz Kuttner, Ulrich (AT)

(73) Assignee: Infineon Technologies AG, Munich (DE)

( * ) Notice: Subject to any disclaimer, the term of this patent is extended or adjusted under 35 U.S.C. 154(b) by 503 days.

(21) Appl. No.: 11/521,326

(22) Filed: Sep. 14, 2006

(65) Prior Publication Data

US 2008/0070540 A1  Mar. 20, 2008

(51) Int. Cl.
*H04B 1/26* (2006.01)
*H04B 1/28* (2006.01)

(52) U.S. Cl. ............... 455/313; 455/293; 455/323; 455/333; 455/341

(58) Field of Classification Search ............ 455/253.2, 455/291, 293, 313–315, 323–326, 333, 341
See application file for complete search history.

(56) References Cited

U.S. PATENT DOCUMENTS

| 4,480,337 | A | | 10/1984 | Graziadei et al. | |
|---|---|---|---|---|---|
| 5,548,840 | A | * | 8/1996 | Heck | 455/326 |
| 5,886,547 | A | * | 3/1999 | Durec et al. | 327/113 |
| 5,901,350 | A | * | 5/1999 | Stoichita et al. | 455/321 |
| 6,073,002 | A | * | 6/2000 | Peterson | 455/326 |
| 6,104,227 | A | * | 8/2000 | Durec et al. | 327/359 |
| 6,275,688 | B1 | * | 8/2001 | Takagi et al. | 455/326 |
| 6,411,801 | B1 | * | 6/2002 | Kim et al. | 455/333 |
| 7,099,646 | B1 | * | 8/2006 | Jin et al. | 455/313 |

OTHER PUBLICATIONS

Coffing, Danielle et al., "A Low-Noise Low-Power IF Amplifier with Input and Output Impedance Matching," IEEE BCTM 4.1, pp. 66-69, 2000.

* cited by examiner

*Primary Examiner*—Simon D Nguyen
(74) *Attorney, Agent, or Firm*—Brinks Hofer Gilson & Lione

(57) ABSTRACT

An RF amplifier for amplifying a composite RF signal includes a first RF signal and a second RF signal. The amplifier includes a first amplifying stage for providing a first amplified signal a second amplifying stage for providing a second amplified signal, a third amplifying stage for providing a third amplified signal and a fourth amplifying stage for providing a fourth amplified signal, the fourth amplifying stage being arranged after the third amplifying stage. The respective amplified signals are summed up to obtain amplified RF signals.

24 Claims, 8 Drawing Sheets

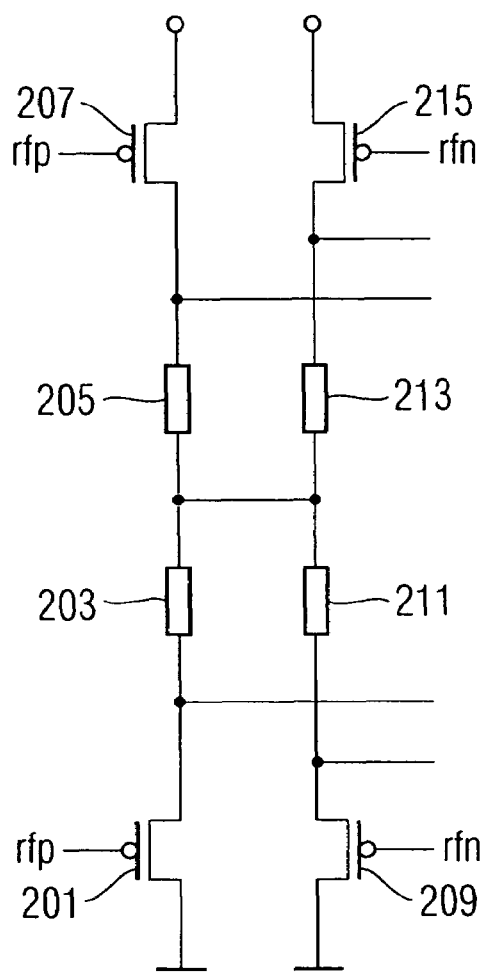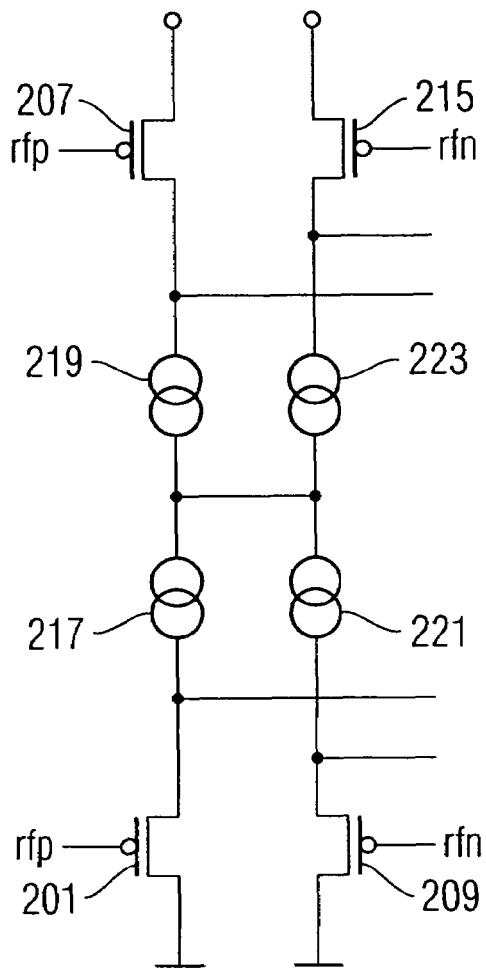

RF AMPLIFIER

BACKGROUND

1. Technical Field

The present invention is directed to radio-frequency (RF) amplifiers, in particular to RF amplifiers in RF mixers.

2. Background Information

RF amplifiers may be used for pre-amplifying RF signals received from an antenna and/or a subsequent low-noise amplifier (LNA) before providing the amplified signals to a mixer, such as a Gilbert mixer shown in FIG. 7. The Gilbert mixer comprises a pre-amplifying stage 701 and a mixing circuit 703 mixing the amplified signals provided by the pre-amplifying stage 701 using local oscillator signals in order to obtain e.g. base band or intermediate frequency (IF) signals. The Gilbert mixer shown in FIG. 7 may comprise MOS switches steering the signals and the DC to the load. However, the switches generate 1/f noise which appears at the output of the mixer during switch-transitions.

The amount of the 1/f noise depends on the applied technology. For example, the 1/f noise increases with decreasing sizes associated with current chip technologies. To reduce the 1/f noise, a passive mixer as shown in FIG. 6 may be used. The passive mixer comprises a pre-amplifying stage 601 for pre-amplifying RF signals from e.g. an antenna and/or a balloon and may be designed to form a low-noise amplifier (LNA). The amplified RF signals are provided to a mixing circuit 603 comprising a small capacitor 605 for removing high-frequency components. The mixing circuit 603 comprises an operational amplifier 607 forming, for example, a first intermediate frequency amplifier with a low-pass response and comprising single pole low-pass filters (LPF) with a capacitor and a resistor, respectively. The output signals of the operational amplifier 607 may be provided to an intermediate frequency filter. The 1/f noise is reduced, since the bias current (DC) of the preceding gain stage 601 does not flow through the switches and therefore does not generate the 1/f noise. The bias current in the LNA 601 is defined by the thermal noise. The higher the current in this gain stage, the better is the noise figure of the mixer. However, with increasing current in the gain stage the power dissipation in the mixer increases.

BRIEF SUMMARY

According to an aspect, the disclosure provides an RF amplifier for amplifying a composite RF signal being receivable from e.g. an antenna and/or from a low-noise amplifier. The composite RF signal may comprise a first RF signal and a second RF signal. For example, the composite RF signal is a differential signal being formed by the first RF signal and the second RF signal.

The RF amplifier may comprise a first amplifying circuit for amplifying the first RF signal, the first amplifying circuit comprising a first amplifying stage for providing a first amplified signal and a second amplifying stage for providing a second amplified signal, the second amplifying stage being arranged after the first amplifying stage. For example, the first and second amplifying stages are arranged in series.

The RF amplifier further comprises a second amplifying circuit for amplifying the second RF signal. The second amplifying circuit may comprise a third amplifying stage for providing a third amplified signal and a fourth amplifying stage for providing a fourth amplified signal, the fourth amplifying stage being arranged after the third amplifying stage. For example, the third and fourth amplifying stages may be arranged in series.

The RF amplifier may further comprise a first summation node for summing up the first and the second amplified signal to provide a first amplified RF signal. Correspondingly, the RF amplifier may comprise a second summation node for summing up the third and the fourth amplified signal to provide a second amplified RF signal. The first and the second amplified signal form an amplified composite RF signal which may be provided, for example, to a mixing circuit or to a further processing stage for further processing. For example, the outputs of the first and second amplifying stage may be coupled, such as electrically connected or coupled via a capacitor and form the first summation node. Correspondingly, the outputs of the third and fourth amplifying stage may be coupled, such as electrically connected or coupled via a capacitor and form the second summation node. However, the first and second summation nodes may be formed by other elements configured to sum up the respective signals.

According to an aspect, the first, second, third and fourth amplifying stages respectively comprise a transistor and a resistor connected, such as in series or a transistor or a current source e.g. connected in series.

According an aspect, the first and second amplifying stage may respectively comprise an input for receiving the first RF signal. Thus, the first and the second amplifying stage receive individually the first RF signal or a version based thereon for amplifying purposes. Correspondingly, the third and the fourth amplifying stage respectively comprise an input for receiving the second RF signal.

According to an aspect, the first and the second amplifying stage are connected in series. Correspondingly, the third and fourth amplifying stage are connected in series, wherein a node between the first and the second amplifying stage is connected to a node between the third and fourth amplifying stage. Thus, the voltages across the amplifying stages are equal.

The invention further provides an RF amplifier for amplifying a composite RF signal, the composite RF signal comprising a first RF signal and a second RF signal forming the composite RF signal which may be differential.

The RF amplifier may comprise a first amplifying circuit for amplifying the first RF signal, wherein the first amplifying circuit may comprise a first amplifying stage for providing a first amplified signal and a second amplifying stage for providing a second amplified signal. The second amplifying stage is arranged after the first amplifying stage. According to an aspect, the first and the second amplifying stages may be connected in series.

The RF mixer further comprises a second amplifying circuit for amplifying the second RF signal, the second amplifying circuit comprising a third amplifying stage for providing a third amplified signal and a fourth amplifying stage for providing a fourth amplified signal, the fourth amplifying stage being arranged after the third amplifying stage.

According to an aspect, a node between the first and the second amplifying stage is connected to a node between the third and fourth amplifying stage for purposes of symmetry of potentials.

According to an aspect, the first amplifying stage, the second amplifying stage, the third amplifying stage and the fourth amplifying stage respectively comprise a transistor and a resistor connected in series or a transistor and a current source connected in series.

According to an aspect, the first amplifying stage and the second amplifying stage respectively comprise an input for receiving the first RF signal, the third amplifying stage and the fourth amplifying stage respectively comprising an input for receiving the second RF signal.

According to an aspect, the RF amplifier further comprises a first summation node for summing up the first and the second amplified signal to provide a first amplified RF signal and a second summation node for summing up the third and the fourth amplified signal to provide a second amplified RF signal, the first and second amplified signal forming the amplified composite RF signal.

The disclosure further provides a RF mixer comprising an RF amplifier and a mixing circuit for mixing the first RF signal with a first LO signal and for mixing the second RF signal with a second LO signal.

The disclosure further provides a device for amplifying a RF composite signal to obtain an amplified composite RF signal, the RF composite signal comprising a first RF signal and a second RF signal. The device comprises a first means for amplifying the first RF signal, the first means for amplifying comprising a first amplifying stage for providing a first amplified signal and a second amplifying stage for providing a second amplified signal, the second amplifying stage being arranged after the first amplifying stage, a second means for amplifying the second RF signal, the second means for amplifying comprising a third amplifying stage for providing a third amplified signal and a fourth amplifying stage for providing a fourth amplified signal, the fourth amplifying stage being arranged after the third amplifying stage, a first means for summing up the first and the second amplified signal to provide a first amplified RF signal and a second means for summing for summing up the third and the fourth amplified signal to provide a second amplified RF signal, the first and second amplified signal forming the amplified composite RF signal.

According to an aspect, the first amplifying stage, the second amplifying stage, the third amplifying stage and the fourth amplifying stage respectively comprise a transistor and a resistor connected in series or a transistor and a current source connected in series.

According to an aspect, the first amplifying stage and the second amplifying stage respectively comprise an input for receiving the first RF signal, wherein the third amplifying stage and the fourth amplifying stage respectively comprise an input for receiving the second RF signal.

According to an aspect, the first amplifying stage and the second amplifying stage are connected in series; the third amplifying stage and the fourth amplifying stage are connected in series, wherein a node between the first amplifying stage and the amplifying stage is connected to a node between the third amplifying stage and the fourth amplifying stage.

The disclosure further provides a RF mixing device comprising device for amplifying and a means for mixing the first RF signal with a first LO signal and for mixing the second RF signal with a second LO signal.

The disclosure further provides a device for amplifying a RF composite signal, the RF composite signal comprising a first RF signal and a second RF signal. The device comprises a first means for amplifying the first RF signal, the first means comprising a first amplifying stage for providing a first amplified signal and a second amplifying stage for providing a second amplified signal, the second amplifying stage being arranged after the first amplifying stage, a second means for amplifying the second RF signal, the second means comprising a third amplifying stage for providing a third amplified signal and a fourth amplifying stage for providing a fourth amplified signal, the fourth amplifying stage being arranged after the third amplifying stage, wherein a node between the first and the second amplifying stage is connected to a node between the third and the fourth amplifying stage.

According to an aspect, the first amplifying stage, the second amplifying stage, the third amplifying stage and the fourth amplifying stage respectively comprise a transistor and a resistor connected in series or a transistor and a current source connected in series.

According to an aspect, the first amplifying stage and the second amplifying stage respectively comprise an input for receiving the first RF signal, wherein the third amplifying stage and the fourth amplifying stage respectively comprise an input for receiving the second RF signal.

According to an aspect, the device for amplifying further comprises a first means for summing up the first and the second amplified signal to provide a first amplified RF signal and a second means for summing up the third and the fourth amplified signal to provide a second amplified RF signal, the first and second amplified signal forming the amplified composite RF signal.

The disclosure further provides an RF mixing device comprising the inventive device for amplifying according and a device for mixing the first RF signal with a first LO signal and for mixing the second RF signal with a second LO signal.

The disclosure further provides a method for amplifying a composite RF signal to obtain an amplified composite RF signal, the composite RF signal comprising a first RF signal and a second RF signal. The method includes amplifying the first RF signal in a first amplifying stage for providing a first amplified signal and in a second amplifying stage for providing a second amplified signal, the second amplifying stage being arranged after the first amplifying stage, amplifying the second RF signal in a third amplifying stage for providing a third amplified signal and in a fourth amplifying stage for providing a fourth amplified signal, the fourth amplifying stage being arranged after the third amplifying stage, summing up the first and the second amplified signal to provide a first amplified RF signal and summing up the third and the fourth amplified signal to provide a second amplified RF signal, the first and second amplified signal forming the amplified composite RF signal.

The disclosure further provides a method for amplifying a composite RF signal, the composite RF signal comprising a first RF signal and a second RF signal. The method includes amplifying the first RF signal in a first amplifying stage for providing a first amplified signal and in a second amplifying stage for providing a second amplified signal, the second amplifying stage being arranged after the first amplifying stage and amplifying the second RF signal in a third amplifying stage for providing a third amplified signal and in a fourth amplifying stage for providing a fourth amplified signal, the fourth amplifying stage being arranged after the third amplifying stage, a node between the third and the fourth amplifying stage being connected to a node between the first and the second amplifying stage.

The disclosure further provides a method for mixing comprising the inventive method for amplifying according, mixing the first RF signal with a first LO signal and mixing the second RF signal with a second LO signal.

The disclosure further provides a computer program product for carrying out one of the inventive methods when the computer program product runs on a computer.

BRIEF DESCRIPTION OF THE DRAWINGS

Before the invention is described in detail, it is to be understood that this invention is not limited to the particular component parts of the devices described or steps of the methods described as such devices and methods may vary. It is also to be understood that the terminology used herein is for purposes of describing particular embodiments only, and is not intended to be limiting. It must be noted that, as used in the specification and the appended claims, the singular forms "a," "an" and "the" include singular and/or plural referents unless the context clearly dictates otherwise.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

Further embodiments of the invention will be described with reference to the following figures, in which:

FIGS. 1a-1d shows diagrams of RF amplifiers.

FIGS. 2a and 2b show diagrams of RF amplifiers.

FIGS. 3a-3d show diagrams of amplifying stages.

Figure 4:
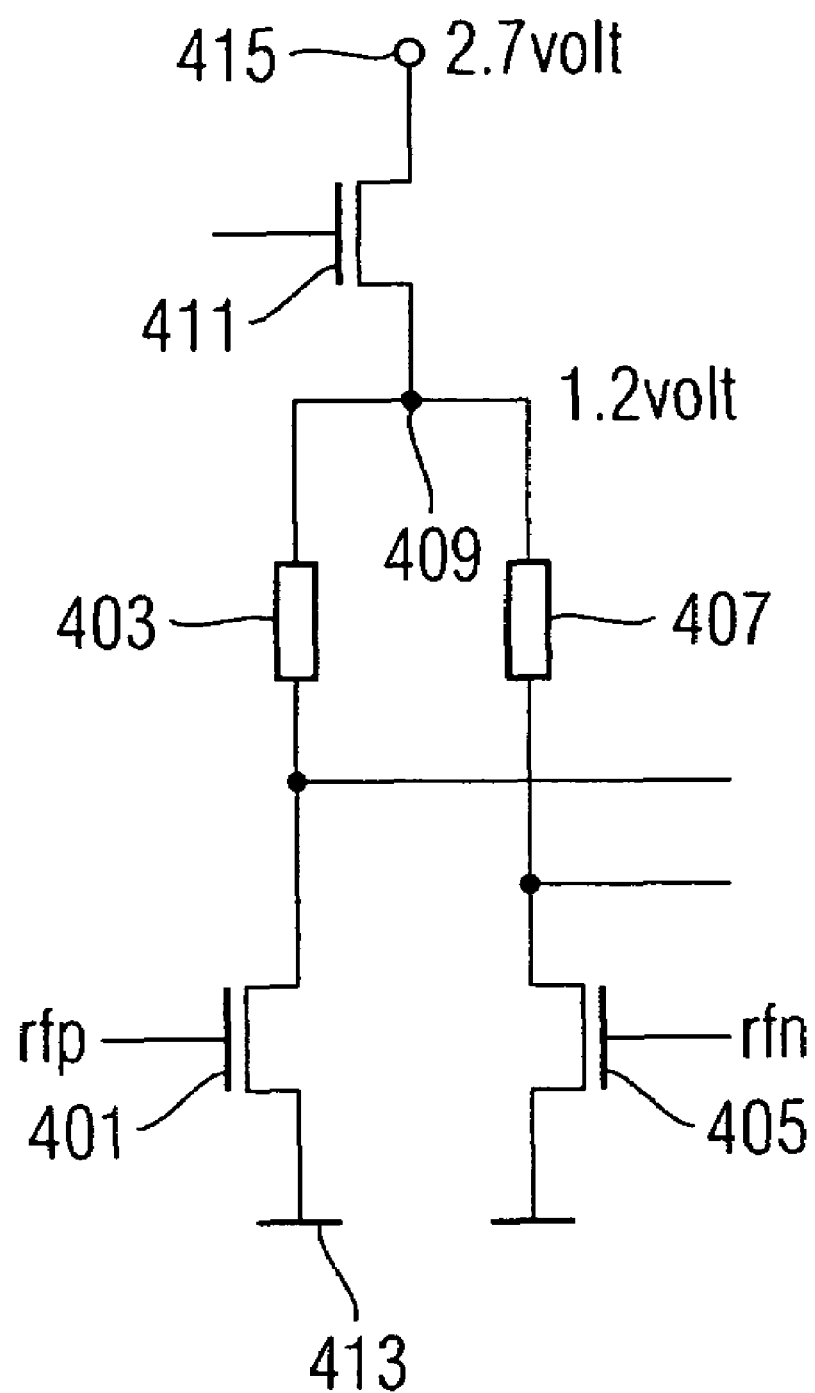

FIG. 4 shows a diagram of an amplifying stage.

Figure 5:
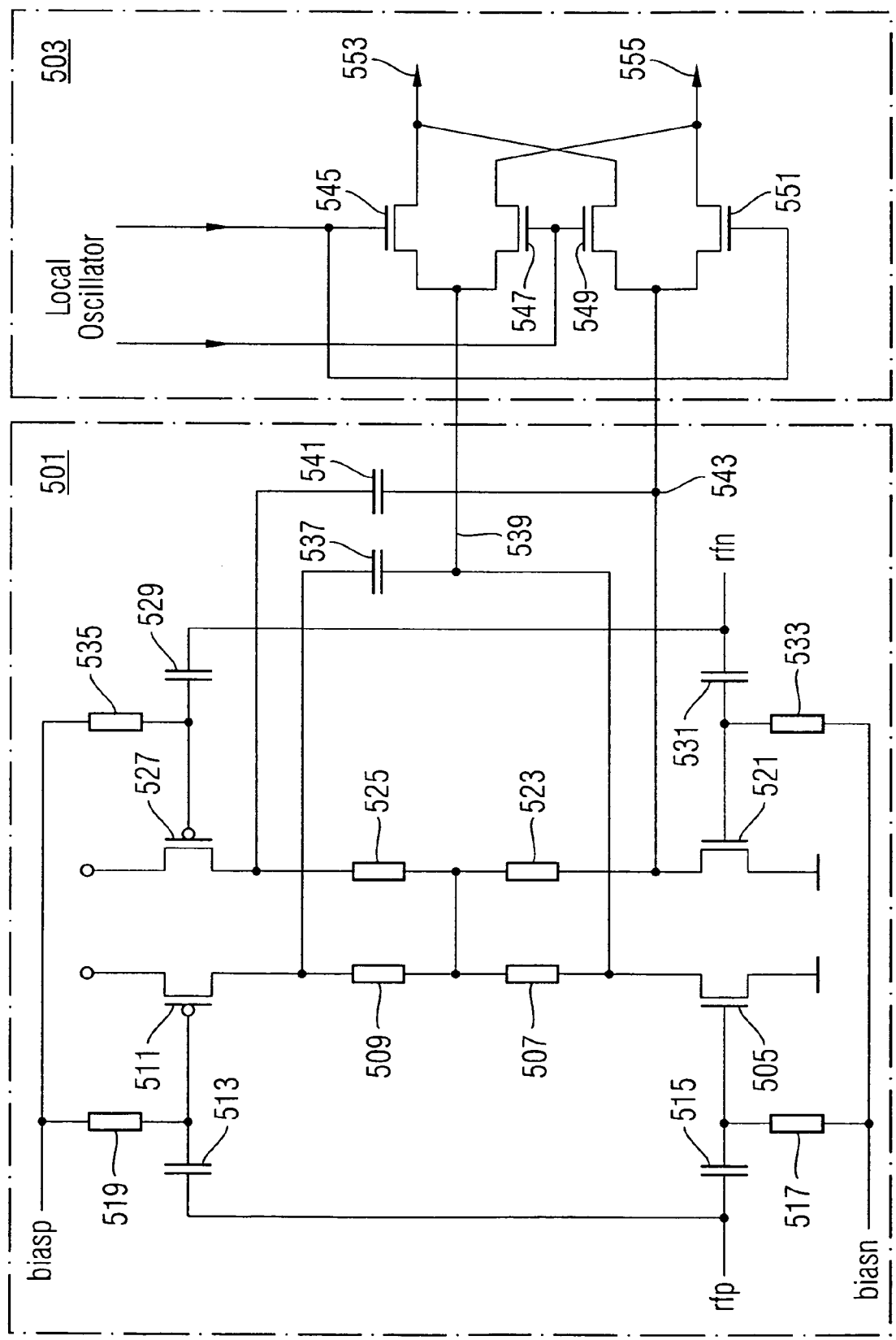

FIG. 5 shows a diagram of RF mixer.

Figure 6:
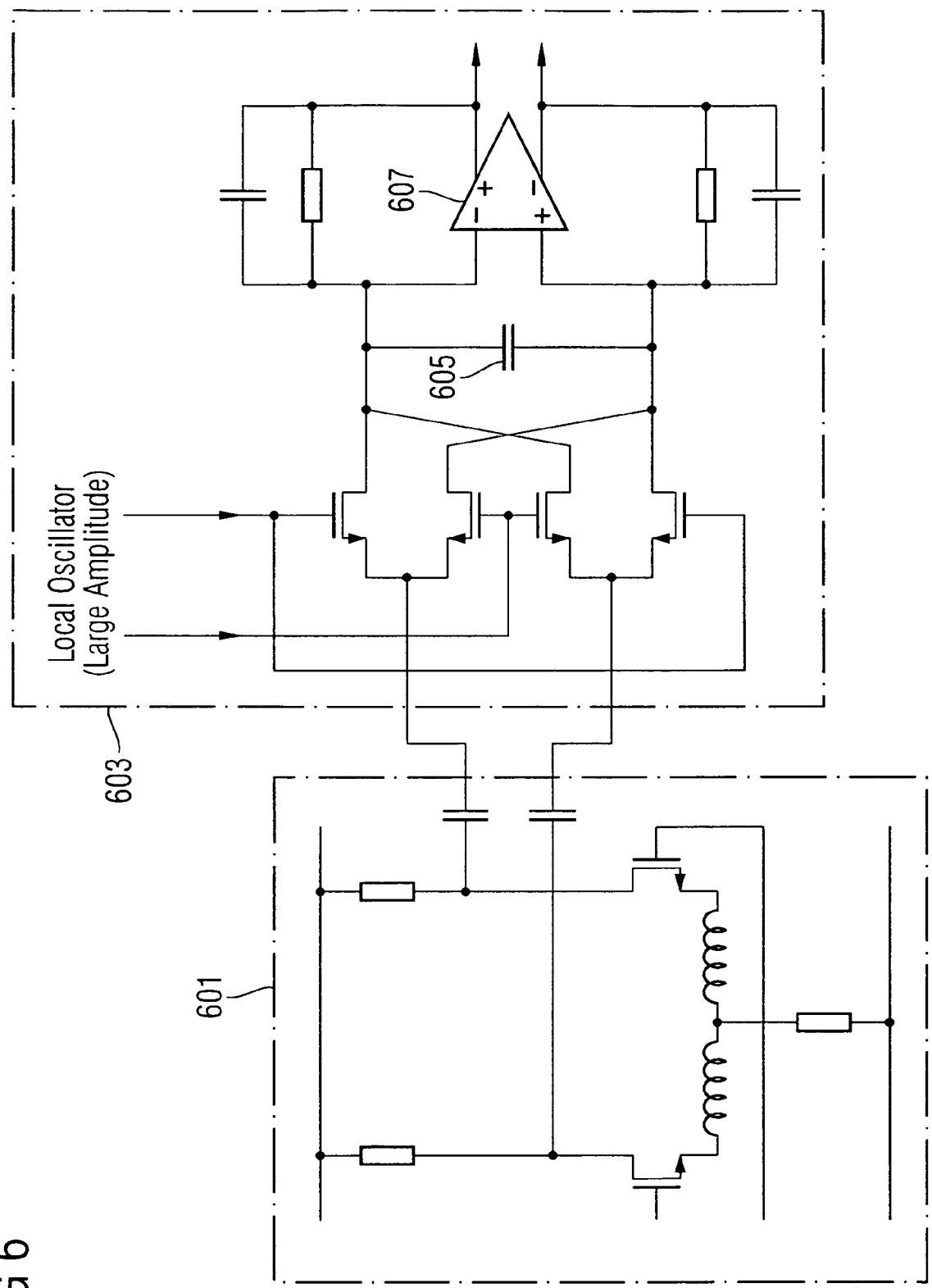

FIG. 6 shows a passive mixer.

Figure 7:
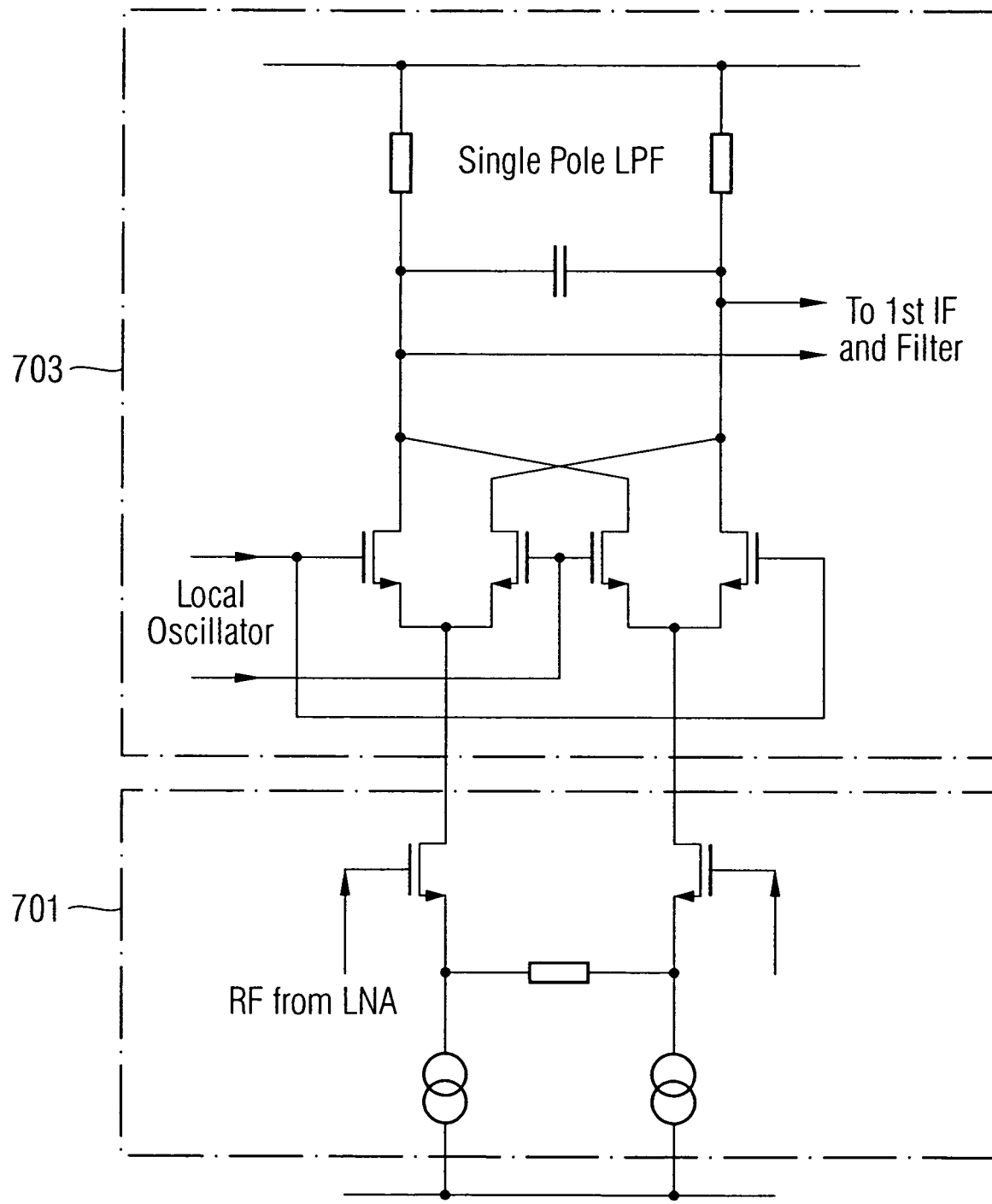

FIG. 7 shows a Gilbert mixer.

DETAILED DESCRIPTION

Figure 1A:
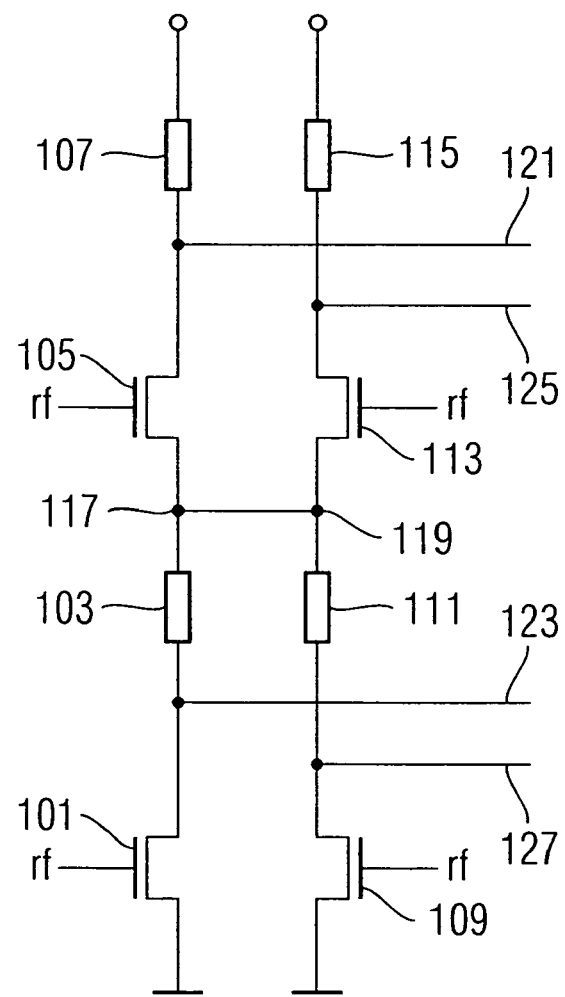

FIG. 1a shows an RF amplifier with a first amplifying circuit comprising a transistor 101, a resistor 103 connected to a terminal of the transistor 101, a transistor 105 and a resistor 107 connected to a terminal of the transistor 105. The transistor 101 and the resistor 103 form a first amplifying stage of the first amplifying circuit. Correspondingly, the transistor 105 and the resistor 107 form a second amplifying stage of the first amplifying circuit.

The RF amplifier further comprises a second amplifying circuit comprising a transistor 109, a resistor 111 coupled to a terminal of the transistor 109, a transistor 113 and a resistor 115 coupled to a terminal of the transistor 113. The transistor 109 and the resistor 111 form a third amplifying stage and the transistor 113 and the resistor 115 form a fourth amplifying stage of the second amplifying circuit. Furthermore, a node 117 between the first and second amplifying stage is connected to a node 119 between the third and fourth amplifying stage.

The third amplifying circuit has two outputs 121 and 123, respectively, for providing a first and a second amplified signal from a corresponding amplifying stage. Correspondingly, the second amplifying circuit comprises two outputs 125, 127 for providing amplified RF signals from the third and fourth amplifying stage.

The first RF signal may be simultaneously applied to the gates of the transistors 101 and 105. Correspondingly, the second RF signal may be simultaneously applied to the gates of the transistors 109 and 113.

Figure 1B:
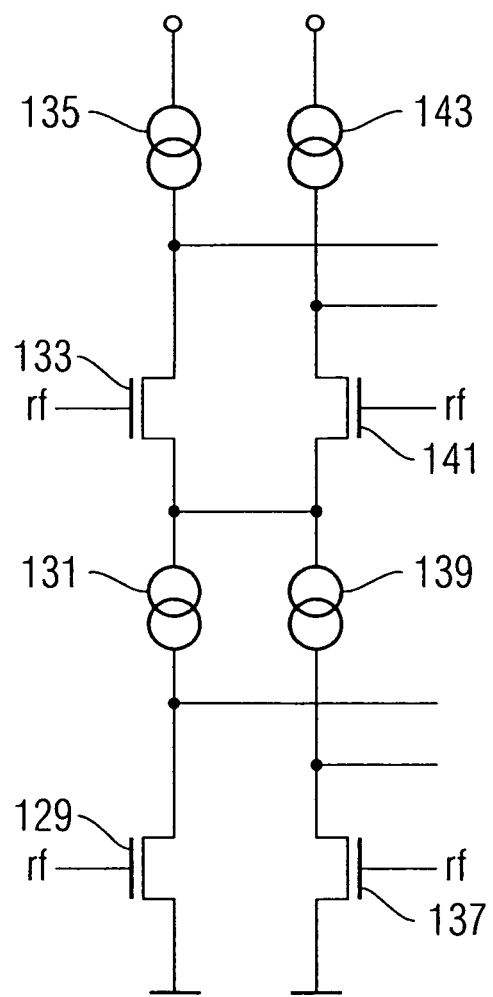

FIG. 1b shows an RF amplifier according to another embodiment. The principle structure of the RF amplifier shown in FIG. 1b corresponds to the structure of the amplifier shown in FIG. 1a. The amplifier of FIG. 1b comprises a first amplifying circuit with a transistor 129, a current source 131, a transistor 133 and a current source 135. The transistor 129 and the current source 131 form a first amplifying stage. The transistor 133 and the current source 135 form a second amplifying stage.

The RF amplifier further comprises a second amplifying circuit with a transistor 137, a current source 139, a transistor 141 and a current source 143. The transistor 137 and the current source 139 form a fourth amplifying stage. Correspondingly, the transistor 141 and the current source 143 form a second amplifying stage. Furthermore, a node between the current source 139 and the transistor 141 is connected to a node between the current source 131 and the transistor 133. The first and the second RF signals may be applied to the first and the second amplifying circuit as discussed in connection with the embodiment of FIG. 1a.

Figure 1C:
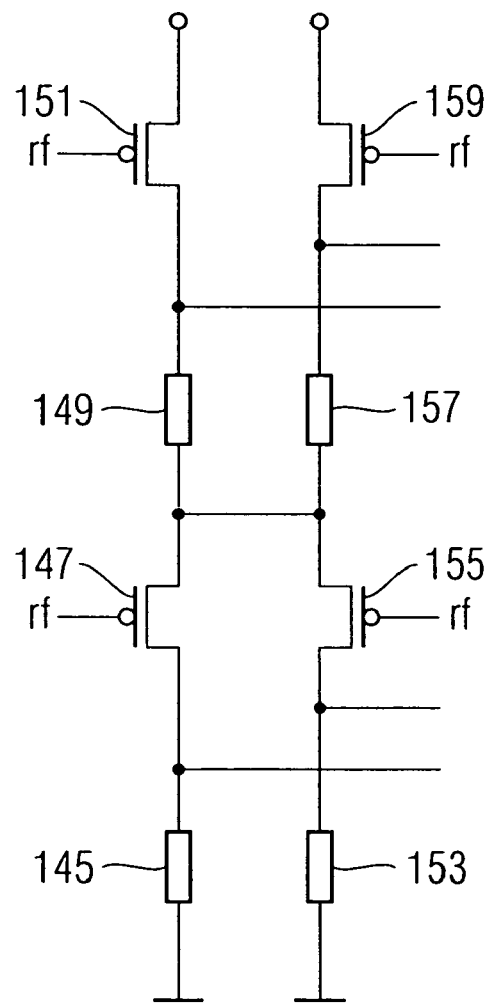

FIG. 1c shows an RF amplifier according to another embodiment. The amplifier in FIG. 1c has a structure with corresponds to the structure of the amplifiers shown in FIGS. 1a and 1b. The RF amplifier comprises a first amplifying circuit with a resistor 145, a transistor 147, a resistor 149 and a transistor 151. The resistor 145 and the transistor 147 form a first amplifying stage. The resistor 149 and the transistor 151 form a second amplifying stage.

The RF amplifier further comprises a second amplifying circuit with a resistor 153, a transistor 155, a resistor 157 and a transistor 159. The resistor 153 and the transistor 155 form a third amplifying stage. The resistor 157 and the transistor 159 form a fourth amplifying stage. Furthermore, a node between the transistor 147 and the resistor 149 is connected to a node between the transistor 155 and the resistor 157. In addition, the transistors 147, 151, 155 and 159 may be of a different type as the transistors of the embodiments shown in FIGS. 1a and 1b.

The first and the second RF signals may be applied to the first and the second amplifying circuit as described in connection with the embodiments of FIGS. 1a and 1b.

Figure 1D:
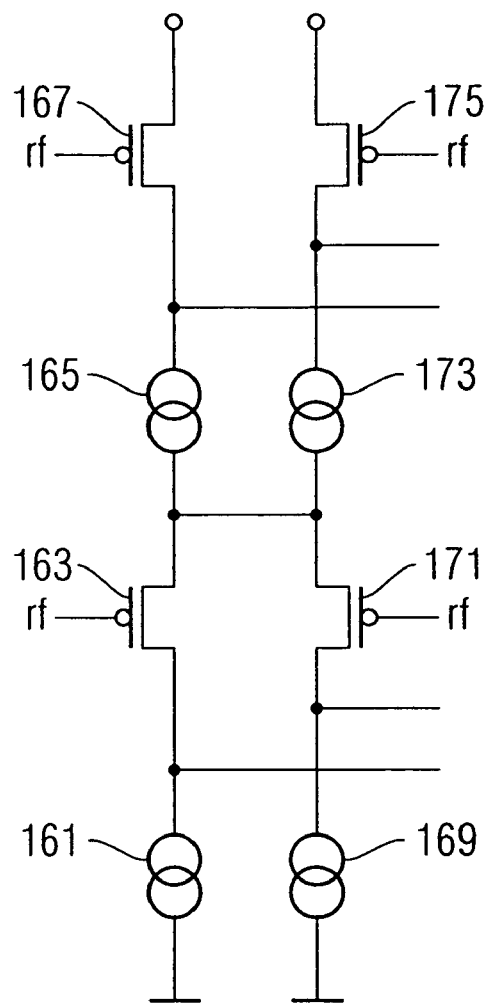

FIG. 1d shows an RF amplifier according to another aspect having a structure corresponding to a structure of a respective amplifier shown in FIGS. 1a to 1c. The RF amplifier comprises a first amplifying circuit with a current source 161, a transistor 163, a current source 165 and a transistor 167. The RF amplifier further comprises a second amplifying circuit comprising a current source 169, a transistor 171, a current source 173 and a transistor 175.

The current source 161 and the transistor 163 form a first amplifying stage of the first amplifying circuit. The current source 165 and the transistor 167 form a second amplifying stage of the first amplifying circuit. Correspondingly, the current source 169 and the transistor 171 form a third amplifying stage of the second amplifying circuit. The current source 173 and the transistor 175 form a fourth amplifying stage of the second amplifying circuit. Furthermore, a node between the first and the second amplifying stage is connected to a node between the third and the fourth amplifying stage. The RF amplifier may be operated as described in connection with the embodiments of FIGS. 1a to 1c.

The elements of the RF amplifiers are interconnected as shown in FIGS. 1a to 1d. The current sources shown in FIGS. 1b and 1d may e.g. be formed by e.g. transistor circuits.

The first, second, third and fourth amplifying stages respectively form individual $g_m$ stages wherein, for example, the second $g_m$ stage may be located at the top of the first $g_m$ stage so that a higher voltage may be distributed over the stages in such a way that none of the devices or elements is exposed to more than the maximum allowable voltage. The same applies to the third and second $g_m$ stage.

For example, the inventive RF amplifier may be used in a mixer, such as in a passive or in an active mixer. In this case, a current for a $g_m$ stage is used at least for two $g_m$ stages so that higher voltages are distributed over the stages in such a way that none of the devices is driven by the maximum allowable voltage. By summing up the outputs of two or more $g_m$ stages, the performance with respect to the noise and the linearity of a mixer may be increased. When compared with the classical approaches, the current and therefore the power dissipation would have to be doubled in order to increase the same performance.

FIG. 2a shows an RF amplifier comprising a first amplifying circuit with a transistor 201, a resistor 203 connected to a terminal of the transistor 201, a resistor 205 connected to the resistor 203 and a transistor 207 having a terminal connected to the resistor 205. The transistor 201 and the resistor 203 form a first amplifying stage. The resistor 205 and the transistor 207 form a second amplifying stage.

The RF amplifier further comprises a second amplifying circuit with a transistor 209, a resistor 211 connected to a terminal of the transistor 209, a resistor 213 connected to the resistor 211 and a transistor 215 having a terminal connected to the resistor 213. The transistor 201 and the resistor 211 form a third amplifying stage. The resistor 213 and the transistor 215 form a second amplifying stage.

The elements of the amplifier are interconnected as shown in FIG. 2a. Furthermore, the first RF signal (rap) may be simultaneously applied to the gates of the transistors 201 and 207 of the first and the second amplifying stage. Correspondingly, the second RF signal (run) may simultaneously be applied to the gates of the transistors 209 and 215 of the third and fourth amplifying stage.

FIG. 2b shows an example RF amplifier. The structure of the RF amplifier shown in FIG. 2b corresponds to the structure of the RF amplifier of FIG. 2a. In difference, the current sources 217, 219, 221 and 223 replace the corresponding resistors.

Referring to FIGS. 2a and 2b, a node between respective first and second amplifying stages is connected to a node between respective second and fourth amplifying stages. Moreover, the output signals of the first and second amplifying stages may be summed up to obtain an amplified signal. The same applies to the output signals of the respective third and fourth amplifying stage.

In FIGS. 3a to 3d amplifying stages are shown which respectively form e.g. differential amplifying stages. The amplifying stages shown in FIGS. 3a to 3d may be stacked over each other in order to obtain amplifying circuits, wherein a number of amplifying stages is preferably greater than 1.

Figure 3A:
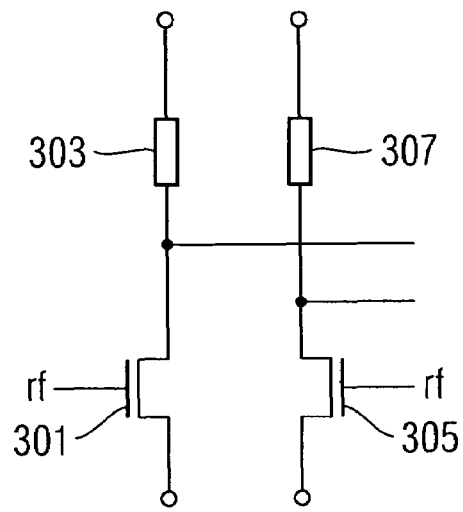

FIG. 3a shows an amplifying stage comprising a series circuit comprising a transistor 301 and a resistor 303 forming e.g. an amplifying stage of e.g. a first or a second amplifying circuit. Furthermore, a further amplifying stage with a transistor 305 and a resistor 307 arranged in series is provided. The amplifying stage and the further amplifying stage may form a differential amplifying stage for simultaneously amplifying a first and/or a second RF signal.

Figure 3B:
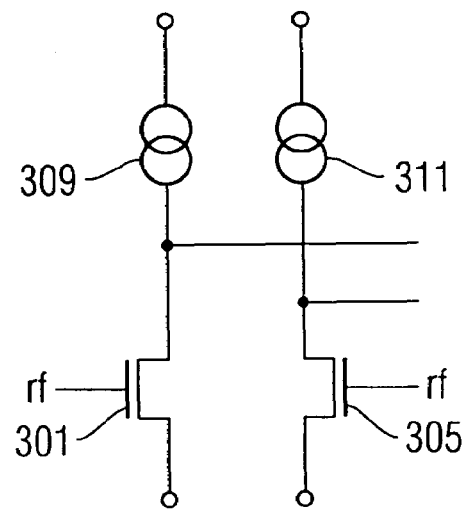

The amplifying stages shown in FIG. 3b correspond to the amplifying stages shown in FIG. 3a with the exception that the transistors 303 and 307 shown in FIG. 3a are replaced by current sources 309 and 311.

Figure 3C:
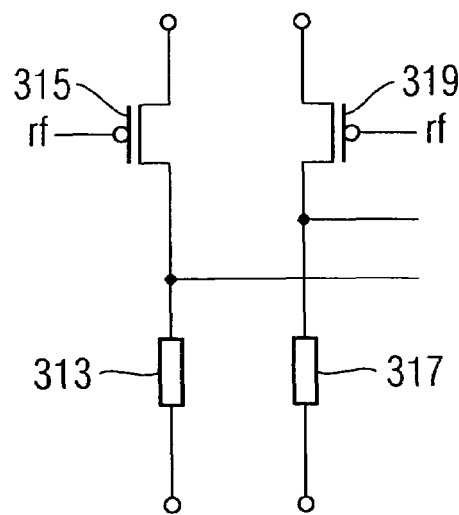

Referring to FIG. 3c, an amplifying stage comprises a resistor 313 and a transistor 315 arranged in series. A further amplifying stage comprises a resistor 317 and a transistor 319 arranged in series. The transistors 315 and 319 may be of different polarity type as the transistors shown in FIGS. 3a and 3b.

Figure 3D:
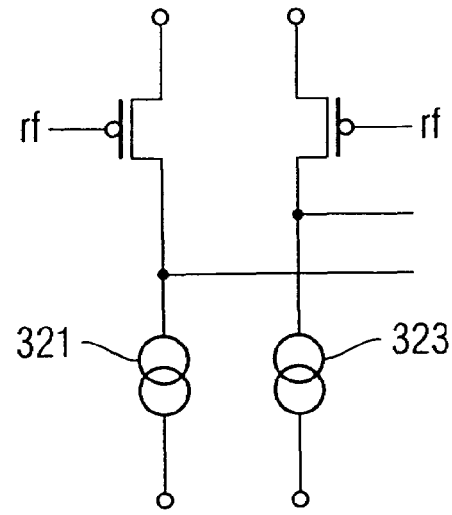

In the amplifying stages shown in FIG. 3d correspond to the amplifying stages shown in FIG. 3c with the exception that the resistors 313 and 317 are replaced by the current sources 321 and 323.

The amplifying stages shown in FIGS. 3a to 3d form respectively a differential pair building e.g. a single $g_m$ stage. This $g_m$ stage may be connected to a load built by resistors or current sources or a combination of both. If using current source loads, a common mode regulation may be used.

In modern deep sub-micron technologies, the supply voltage may drop down to less than e.g. 1.2 V. However, the battery voltage for mobile phones may remain at e.g. 3 up to 5 V due to supply requirements of the power amplifier driving e.g. an antenna. For example, 2.7 V may be used for the supply of the analog blocks, wherein a serial regulator may generate a voltage at 1 or 1.2 V for the respective $g_m$ stage as depicted in FIG. 4.

FIG. 4 shows an amplifying stage with a transistor 401 and a resistor 403 arranged in series with the transistor 401. A further amplifying stage comprises a transistor 405 arranged in series with a resistor 407. The amplifying stages are connected via a node 409 to which a transistor 411 is coupled. The transistor 411 forms a voltage regulator regulating a voltage at the node 401 with respect to a terminal 413 of the transistor 401 at 1.2 V if 2.7 V are applied at a node 415 of the transistor 411. At a gate of a transistor 401, a first RF signal (rap) may be applied. Correspondingly, at a gate of the transistor 405, a second RF signal (run) may be applied. According to an aspect, further amplifying stages may be connected to the amplifying stages shown in FIG. 5 so that more power is available for a respective $g_m$ stage.

FIG. 5 shows an RF mixer comprising an RF amplifier 501 and a mixing circuit 503 arranged after the RF amplifier 501. The RF amplifier 501 comprises a first amplifying circuit with a first amplifying stage being formed by a transistor 505 and a resistor 507. The first amplifying circuit further comprises a second amplifying stage being formed by a resistor 509 and a transistor 511. By way of example, the transistors 505 and 511 are of different (polarity) type. The gates of the transistors 511 and 505 are coupled via capacitors 513 and 515. Furthermore, biasing resistors 517 and 519 are coupled to a gate of transistors 505 and 511, respectively.

The RF amplifier further comprises a second amplifying circuit with a third amplifying stage comprising a transistor 521, a resistor 523, a resistor 525 and a transistor 527. The transistor 521 and the resistor 523 form a third amplifying stage. The resistor 525 and the transistor 527 form a second amplifying stage. The transistors 527 and 521 are, by way of example, of different polarity type. Furthermore, the gates of the transistors 527 and 521 are coupled via capacitors 529 and 531, respectively. Furthermore, biasing resistors 533 and 535 are coupled respectively to the gates of the associated transistors 527 and 521. The biasing transistors 519 and 535 are connected with each other at a node at which a bias voltage may be applied. Correspondingly, the resistors 517 and 533 are coupled at a node at which a further biasing voltage may be applied.

The second and fourth amplifying stages are connected to the first and third amplifying stages, respectively. Furthermore, the nodes between the amplifying stages are interconnected.

The outputs of the first and second amplifying stage are coupled via a capacitor 537, wherein a terminal of the capacitor 537 forms a first output 539 of the first amplifying circuit. Correspondingly, the outputs of the third and fourth amplifying stage are coupled via a capacitor 541, wherein a terminal of the capacitor 541 forms a second output 543 of the second amplifying circuit. Thus, the outputs 539 and 543 form an output pair providing an amplified RF signal in a differential manner.

The outputs 539 and 543 are connected to corresponding inputs of the mixing circuit 503 comprising transistors 545, 547, 549 and 551 arranged as shown in FIG. 5. The gates of the transistors 545 and 551 may be driven by a first local oscillator signal, wherein gates of the transistors 547 and 549 may be driven by a second local oscillator signal. The first and second oscillator signal may be provided by a local oscillator or by a plurality of local oscillators not shown in FIG. 5. The outputs 553 and 555 of the RF mixer may further be formed by corresponding terminals of the transistors 545 and 551.

It is therefore intended that the foregoing detailed description be regarded as illustrative rather than limiting, and that it be understood that it is the following claims, including all equivalents, that are intended to define the spirit and scope of this invention.

The invention claimed is:

1. A radio-frequency (RF) amplifier that amplifies a composite RF signal to obtain an amplified composite RF signal, the composite RF signal including a first RF signal and a second RF signal, the RF amplifier comprising:
   a first amplifying circuit that amplifies the first RF signal, the first amplifying circuit comprising a first amplifying stage that provides a first amplified signal and a second amplifying stage that provides a second amplified signal, the second amplifying stage being arranged after the first amplifying stage;
   a second amplifying circuit that amplifies the second RF signal, the second amplifying circuit comprising a third amplifying stage that provides a third amplified signal and a fourth amplifying stage that provides a fourth amplified signal, the fourth amplifying stage being arranged after the third amplifying stage;
   a first summation node that sums up the first amplified signal and the second amplified signal to provide a first amplified RF signal; and
   a second summation node that sums up the third amplified signal and the fourth amplified signal to provide a second amplified RF signal, the first amplified and second amplified signal forming the amplified composite RF signal.

2. The RF amplifier of claim 1, where the first amplifying stage, the second amplifying stage, the third amplifying stage and the fourth amplifying stage respectively comprise a transistor and a resistor connected in series or a transistor and a current source connected in series.

3. The RF amplifier of claim 1, where the first amplifying stage and the second amplifying stage respectively comprise an input that receives the first RF signal, the third amplifying stage and the fourth amplifying stage respectively comprise an input that receives the second RF signal.

4. The RF amplifier of claim 1, the first amplifying stage and the second amplifying stage being connected in series, the third amplifying stage and the fourth amplifying stage being connected in series, a node between the first amplifying stage and the second amplifying stage being connected to a node between the third amplifying stage and the fourth amplifying stage.

5. A radio-frequency (RF) mixer, comprising:
   an RF amplifier that amplifies a composite RF signal to obtain an amplified composite RF signal, the composite RF signal comprising a first RF signal and a second RF signal, the RF amplifier comprising:
   a first amplifying circuit that amplifies the first RF signal, the first amplifying circuit comprising a first amplifying stage that provides a first amplified signal and a second amplifying stage that provides a second amplified signal, the second amplifying stage being arranged after the first amplifying stage;
   a second amplifying circuit that amplifies the second RF signal, the second amplifying circuit comprising a third amplifying stage that provides a third amplified signal and a fourth amplifying stage that provides a fourth amplified signal, the fourth amplifying stage being arranged after the third amplifying stage;
   a first summation node that sums up the first and the second amplified signal to provide a first amplified RF signal; and
   a second summation node that sums up the third amplified signal and the fourth amplified signal to provide a second amplified RF signal, the first and second amplified signal forming the amplified composite RF signal; and
   a mixing circuit that mixes the first RF signal with a first local oscillator signal and that mixes the second RF signal with a second local oscillator signal.

6. A radio-frequency (RF) amplifier to amplify a composite RF signal, the composite RF signal comprising a first RF signal and a second RF signal, the RF amplifier comprising:
   a first amplifying circuit that amplifies the first RF signal, the first amplifying circuit comprising a first amplifying stage that provides a first amplified signal and a second amplifying stage that provides a second amplified signal, the second amplifying stage being arranged after the first amplifying stage;
   a second amplifying circuit that amplifies the second RF signal, the second amplifying circuit comprising a third amplifying stage that provides a third amplified signal and a fourth amplifying stage that provides a fourth amplified signal, the fourth amplifying stage being arranged after the third amplifying stage, a node between the third and the fourth amplifying stage being connected to a node between the first and the second amplifying stage.

7. The RF amplifier of claim 6, the first amplifying stage, the second amplifying stage, the third amplifying stage and the fourth amplifying stage respectively comprising a transistor and a resistor connected in series or a transistor and a current source connected in series.

8. The RF amplifier of claim 6, the first amplifying stage and the second amplifying stage respectively comprising an input that receives the first RF signal, the third amplifying stage and the fourth amplifying stage respectively comprising an input that receives the second RF signal.

9. The RF amplifier of claim 6, further comprising:
   a first summation node that sums up the first amplified signal and the second amplified signal to provide a first amplified RF signal; and
   a second summation node that sums up the third amplified signal and the fourth amplified signal to provide a second amplified RF signal, the first and second amplified signal forming the amplified composite RF signal.

10. A radio-frequency (RF) mixer, comprising:
    a RF amplifier that amplifies a composite RF signal, the composite RF signal comprising a first RF signal and a second RF signal, the RF amplifier comprising:
    a first amplifying circuit that amplifies the first RF signal, the first amplifying circuit comprising a first amplifying stage that provides a first amplified signal and a second amplifying stage that provides a second amplified signal, the second amplifying stage being arranged after the first amplifying stage;

a second amplifying circuit that amplifies the second RF signal, the second amplifying circuit comprising a third amplifying stage that provides a third amplified signal and a fourth amplifying stage that provides a fourth amplified signal, the fourth amplifying stage being arranged after the third amplifying stage, a node between the third and the fourth amplifying stage being connected to a node between the first and the second amplifying stage; and a mixing circuit that mixes the first RF signal with a first local oscillator signal and that mixes the second RF signal with a second local oscillator signal.

11. A device to amplify a radio-frequency (RF) composite signal to obtain an amplified composite RF signal, the RF composite signal comprising a first RF signal and a second RF signal, the device comprising:

first means for amplifying the first RF signal, the first means for amplifying comprising a first amplifying stage for providing a first amplified signal and a second amplifying stage for providing a second amplified signal, the second amplifying stage being arranged after the first amplifying stage;

second means for amplifying the second RF signal, the second means for amplifying comprising a third amplifying stage for providing a third amplified signal and a fourth amplifying stage for providing a fourth amplified signal, the fourth amplifying stage being arranged after the third amplifying stage;

first means for summing up the first amplified signal and the second amplified signal to provide a first amplified RF signal; and second means for summing for summing up the third amplified signal and the fourth amplified signal to provide a second amplified RF signal, the first and second amplified signal forming the amplified composite RF signal.

12. The device of claim 11, the first amplifying stage, the second amplifying stage, the third amplifying stage and the fourth amplifying stage respectively comprising a transistor and a resistor connected in series or a transistor and a current source connected in series.

13. The device of claim 11, the first amplifying stage and the second amplifying stage respectively comprising an input for receiving the first RF signal, the third amplifying stage and the fourth amplifying stage respectively comprising an input for receiving the second RF signal.

14. The device of claim 11, the first amplifying stage and the second amplifying stage being connected in series, the third amplifying stage and the fourth amplifying stage being connected in series, a node between the first amplifying stage and the amplifying stage being connected to a node between the third amplifying stage and the fourth amplifying stage.

15. A radio-frequency (RF) mixing device, comprising:

first means for amplifying the first RF signal, the first means for amplifying comprising a first amplifying stage for providing a first amplified signal and a second amplifying stage for providing a second amplified signal, the second amplifying stage being arranged after the first amplifying stage;

second means for amplifying the second RF signal, the second means for amplifying comprising a third amplifying stage for providing a third amplified signal and a fourth amplifying stage for providing a fourth amplified signal, the fourth amplifying stage being arranged after the third amplifying stage;

first means for summing up the first amplified signal and the second amplified signal to provide a first amplified RF signal;

second means for summing for summing up the third amplified signal and the fourth amplified signal to provide a second amplified RF signal, the first and second amplified signal forming the amplified composite RF signal; and means for mixing the first RF signal with a first LO signal and for mixing the second RF signal with a second LO signal.

16. A device to amplify a radio-frequency (RF) composite signal, the RF composite signal comprising a first RF signal and a second RF signal, the device comprising:

first means for amplifying the first RF signal, the first means comprising a first amplifying stage for providing a first amplified signal and a second amplifying stage for providing a second amplified signal, the second amplifying stage being arranged after the first amplifying stage;

second means for amplifying the second RF signal, the second means comprising a third amplifying stage for providing a third amplified signal and a fourth amplifying stage for providing a fourth amplified signal, the fourth amplifying stage being arranged after the third amplifying stage, wherein a node between the first and the second amplifying stage is connected to a node between the third and the fourth amplifying stage.

17. The device of claim 16, the first amplifying stage, the second amplifying stage, the third amplifying stage and the fourth amplifying stage respectively comprising a transistor and a resistor connected in series or a transistor and a current source connected in series.

18. The device of claim 16, the first amplifying stage and the second amplifying stage respectively comprising an input for receiving the first RF signal, the third amplifying stage and the fourth amplifying stage respectively comprising an input for receiving the second RF signal.

19. The device of claim 16, further comprising:

first means for summing up the first amplified signal and the second amplified signal to provide a first amplified RF signal; and second means for summing up the third amplified signal and the fourth amplified signal to provide a second amplified RF signal, the first and second amplified signal forming the amplified composite RF signal.

20. A radio-frequency (RF) mixing device to amplify a RF composite signal, the RF composite signal comprising a first RF signal and a second RF signal, the device comprising:

first means for amplifying the first RF signal, the first means comprising a first amplifying stage for providing a first amplified signal and a second amplifying stage for providing a second amplified signal, the second amplifying stage being arranged after the first amplifying stage;

second means for amplifying the second RF signal, the second means comprising a third amplifying stage for providing a third amplified signal and a fourth amplifying stage for providing a fourth amplified signal, the fourth amplifying stage being arranged after the third amplifying stage, wherein a node between the first and the second amplifying stage is connected to a node between the third and the fourth amplifying stage; and a device that mixes the first RF signal with a first LO signal and for mixing the second RF signal with a second LO signal.

21. A method to amplify a composite radio-frequency (RF) signal to obtain an amplified composite RF signal, the composite RF signal comprising a first RF signal and a second RF signal, the method comprising:
- amplifying the first RF signal in a first amplifying stage that provides a first amplified signal and in a second amplifying stage that provides a second amplified signal, the second amplifying stage being arranged after the first amplifying stage;
- amplifying the second RF signal in a third amplifying stage that provides a third amplified signal and in a fourth amplifying stage that provides a fourth amplified signal, the fourth amplifying stage being arranged after the third amplifying stage;
- summing up the first amplified signal and the second amplified signal to provide a first amplified RF signal; and
- summing up the third amplified signal and the fourth amplified signal to provide a second amplified RF signal, the first amplified signal and the second amplified signal forming the amplified composite RF signal.

22. A method to amplify a composite radio-frequency (RF) signal, the composite RF signal comprising a first RF signal and a second RF signal, the method comprising:
- amplifying the first RF signal in a first amplifying stage that provides a first amplified signal and in a second amplifying stage that provides a second amplified signal, the second amplifying stage being arranged after the first amplifying stage;
- amplifying the second RF signal in a third amplifying stage that provides a third amplified signal and in a fourth amplifying stage that provides a fourth amplified signal, the fourth amplifying stage being arranged after the third amplifying stage, a node between the third amplifying stage and the fourth amplifying stage being connected to a node between the first and the second amplifying stage.

23. A method to mix a composite radio-frequency (RF) signal to obtain an amplified composite RF signal, the composite RF signal comprising a first RF signal and a second RF signal, the method comprising:
- amplifying the first RF signal in a first amplifying stage for providing a first amplified signal and in a second amplifying stage for providing a second amplified signal, the second amplifying stage being arranged after the first amplifying stage;
- amplifying the second RF signal in a third amplifying stage for providing a third amplified signal and in a fourth amplifying stage for providing a fourth amplified signal, the fourth amplifying stage being arranged after the third amplifying stage;
- summing up the first and the second amplified signal to provide a first amplified RF signal; and
- summing up the third and the fourth amplified signal to provide a second amplified RF signal, the first and second amplified signal forming the amplified composite RF signal; and
- mixing the first RF signal with a first LO signal and mixing the second RF signal with a second LO signal.

24. A method to mix a composite radio-frequency (RF) signal, the composite RF signal comprising a first RF signal and a second RF signal, the method comprising:
- amplifying the first RF signal in a first amplifying stage that provides a first amplified signal and in a second amplifying stage that provides a second amplified signal, the second amplifying stage being arranged after the first amplifying stage;
- amplifying the second RF signal in a third amplifying stage that provides a third amplified signal and in a fourth amplifying stage that provides a fourth amplified signal, the fourth amplifying stage being arranged after the third amplifying stage, a node between the third and the fourth amplifying stage being connected to a node between the first and the second amplifying stage; and
- mixing the first RF signal with a first LO signal and mixing the second RF signal with a second LO signal.

* * * * *